United States Patent
Culbert et al.

(10) Patent No.: US 6,310,427 B1
(45) Date of Patent: Oct. 30, 2001

(54) CONNECTING APPARATUS FOR ELECTRO-ACOUSTIC DEVICES

(75) Inventors: James A. Culbert, Hingham; William H. Dexter, II, Stoughton; Warren J. Dickie, Holbrook, all of MA (US); Edward Guida, Bristol, RI (US); Anthony Longabard, Wrentham, MA (US)

(73) Assignee: BAE Systems Aerospace Inc., Greenlawn, NY (US)

( * ) Notice: Subject to any disclaimer, the term of this patent is extended or adjusted under 35 U.S.C. 154(b) by 0 days.

(21) Appl. No.: 09/563,823

(22) Filed: May 3, 2000

(51) Int. Cl.[7] ................................................. H01L 41/04
(52) U.S. Cl. ........................ 310/337; 310/334; 310/369; 367/165
(58) Field of Search ...................................... 310/334, 337, 310/369, 348, 346; 367/185, 157, 165, 173, 180

(56) References Cited

U.S. PATENT DOCUMENTS

| | | | |
|---|---|---|---|
| 3,142,035 | * 7/1964 | Harris | 310/337 |
| 4,525,645 | * 6/1985 | Shirley et al. | 310/337 |
| 4,827,459 | * 5/1989 | Franklin | 367/158 |
| 5,130,953 | * 7/1992 | Grosso | 310/334 X |
| 5,694,374 | * 12/1997 | Ripoll et al. | 310/337 X |

* cited by examiner

*Primary Examiner*—Mark O. Budd
(74) *Attorney, Agent, or Firm*—Edwards A. Onders; William B. Ritchie

(57) ABSTRACT

Modified configurations for electrical connectors to ceramic transducers are designed to reduce failure rates due to fatigue during transducer operation. These modifications eliminate or reduce one or both of the problems causing the fatigue, tensile forces acting on electrical wires connected to ceramic electrodes and unreliable solder joints. Star and pin configurations of wire soldered to ceramic transducers control the position of the wires, thus reducing the tensile forces on the wire. Plug connectors use pressure contacts between the ceramics, eliminating the need for solder joints.

16 Claims, 5 Drawing Sheets

CONNECTING APPARATUS FOR ELECTRO-ACOUSTIC DEVICES

FIELD OF THE INVENTION

This invention relates to the field of acoustics and, in particular, to configurations of electrical connectors for electro-acoustic devices.

BACKGROUND OF THE INVENTION

An important feature of any acoustic system is the transducer. A transducer typically incorporates an electro-acoustic element which converts electrical signals into mechanical vibrations in the transmit mode and mechanical vibrations into electrical signals in the receive mode. There are many factors that influence the behavior of a transducer, including the choice of material, physical dimensions, electrical connection, mechanical construction, the external load conditions and the capacity to dissipate heat.

Ceramic cylinders frequently constitute the electro-acoustic element in underwater acoustic transducers and may be either tangentially poled or radially poled. Tangentially poled cylinders provide higher electro-mechanical coupling than radially poled cylinders, making them the preferred choice for many high-power, broadband applications. Tangentially poled cylinders have striped electrodes and operate in the k33 mode (i.e. the direction of the electric field is the same as the direction of the dielectric displacement). Radially poled cylinders have an electrically conductive plating on the outer and inner surfaces and operate in the k31 mode (i.e. the direction of the electric field is orthogonal to the direction of the dielectric displacement).

One particularly common problem with transducer construction is the difficulty of creating a reliable method of making the electrical connection to the electrodes. The conventional way of connecting to the electrodes on ceramic is to use soldered wire. On tangentially poled cylinders this entails soldering daisy-chained wire to alternate striped electrodes while on radially poled cylinders, wire is soldered to the inner and outer surfaces.

One of the problems with this method is that the solder joint is an unreliable connection, subject to failure during either handling or actual operation. This inherent unreliability of the solder joint originates in the soldering process. When solder is applied to one end of a wire, expansion occurs. Then the solder solidifies and as the wire cools it contracts. If additional wire length is not left to compensate for the heating and subsequent cooling, the wire will stretch and generate stress in both the wire and the solder joint. In small tangentially poled ceramic cylinders, the close proximity of the solder connections makes it difficult to leave adequate wire length in the daisy chain to relieve the process-induced stress.

Besides being unreliable, the soldering process is also labor intensive. This is especially true in tangentially poled cylinders with a large number of striped electrodes.

Additional problems with the solder connections occur in high frequency, high power applications. The large acceleration force on the solder joint causes the wire to flex. This can result in mechanical fatigue and wire fracture. The fractured joint could then induce arcing, resulting in catastrophic failure.

Therefore, there is a need for an approach which controls wire flexing in ceramic cylinders using solder joints or eliminates the need for soldering wires to the ceramic altogether. There is also a need for a standardized process that reduces human intervention in transducer manufacture. In addition, there is a need to provide design simplicity, reliability, and reduced labor costs along with improved heat transfer from the ceramic cylinders.

SUMMARY OF THE INVENTION

The present invention presents modified configurations of electrical connectors for an electro-acoustic transducer. One modification replaces the daisy chain configuration on tangentially poled cylinders with a pin configuration that controls the geometry of the soldered wires. The soldered end of each wire runs parallel to the stripe and the other end is substantially perpendicular to the interior of the ceramic cylinder. This prevents tensile forces from acting on the electrical connectors and distributes the flexing over a longer length of wire.

A preferred embodiment of the invention is a plug connector for a tangentially poled cylinder. The plug connector replaces the mechanical solder bond with a contact that relies on pressure to control the conductance. In its most basic form, the plug connector consists of a series of contact carriers that are aligned with the striped electrodes on the ceramic cylinder. Metal electrical contacts are inserted into the carriers and are linked together on an alternating basis to form positive and negative electrical connections. The ceramic cylinder slides onto the plug connector to form an assembled condition where the electrical connection to the ceramic cylinder is achieved through physical contact. This construction forms a basic ceramic cylinder transducer using a plug connector that can be modified depending on the application of the assembly.

The plug connector, by utilizing edge contacts similar to those used in a PC board, provides the electrical connection to the striped electrodes on the ceramic cylinder and eliminates the need to solder to the ceramic. Design simplicity and improved heat transfer are other potential benefits. These are apparent when the material for the plug connector is both electrically and thermally conductive. Use of an electrical conductor eliminates the need to physically connect each contact, and use of a thermal conductor helps dissipate heat from the ceramic.

A preferred embodiment of the plug connector is a construction where the negative contact carriers are incorporated into the metallic structure or foundation that secures the cylindrical transducer. By connecting the structure to the ground of the power amplifier, all of the contact carriers, contacts and negative electrodes are properly grounded. In a similar way, connection to the positive contacts can be simplified by mounting them in a single metallic contact carrier that is properly insulated from ground. By connecting the metallic contact carrier (which resembles a spider, with one leg for each positive contact) to the output of the power amplifier, all of the positive electrodes are properly connected. Thus only two connections, one to the positive spider and the other to the negative foundation, are required to power a plurality of electrodes on the ceramic. This substantially reduces labor costs and improves reliability. Improved heat transfer is achieved by exposing the foundation to surrounding water, thus providing an effective heat path to dissipate heat from the ceramic.

Therefore, it is an aspect of this invention to provide electrical connectors that reduce tensile forces from acting on the connectors during transducer operation.

It is another aspect of the invention to provide electrical connection to striped electrodes on tangentially poled ceramic cylinders through pressure from an electrical contact rather than by soldering wires to striped electrodes.

It is another aspect of the invention to provide electrical connection to the inner surface of a radially poled cylinder through pressure from an electrical contact rather than by soldering a wire to the ceramic.

It is a further aspect of the invention to provide a simple, reliable, and cost effective means of making electrical connections to ceramic cylinder transducers.

It is a further aspect of the invention to provide a modified plug connector of electrically and thermally conductive material for use in ceramic cylinder transducers.

These aspects of the invention are not meant to be exclusive and other features, aspects, and advantages of the present invention will be readily apparent to those of ordinary skill in the art when read in conjunction with the appended claims and accompanying drawings.

DETAILED DESCRIPTION OF THE DRAWINGS

Figure 1:
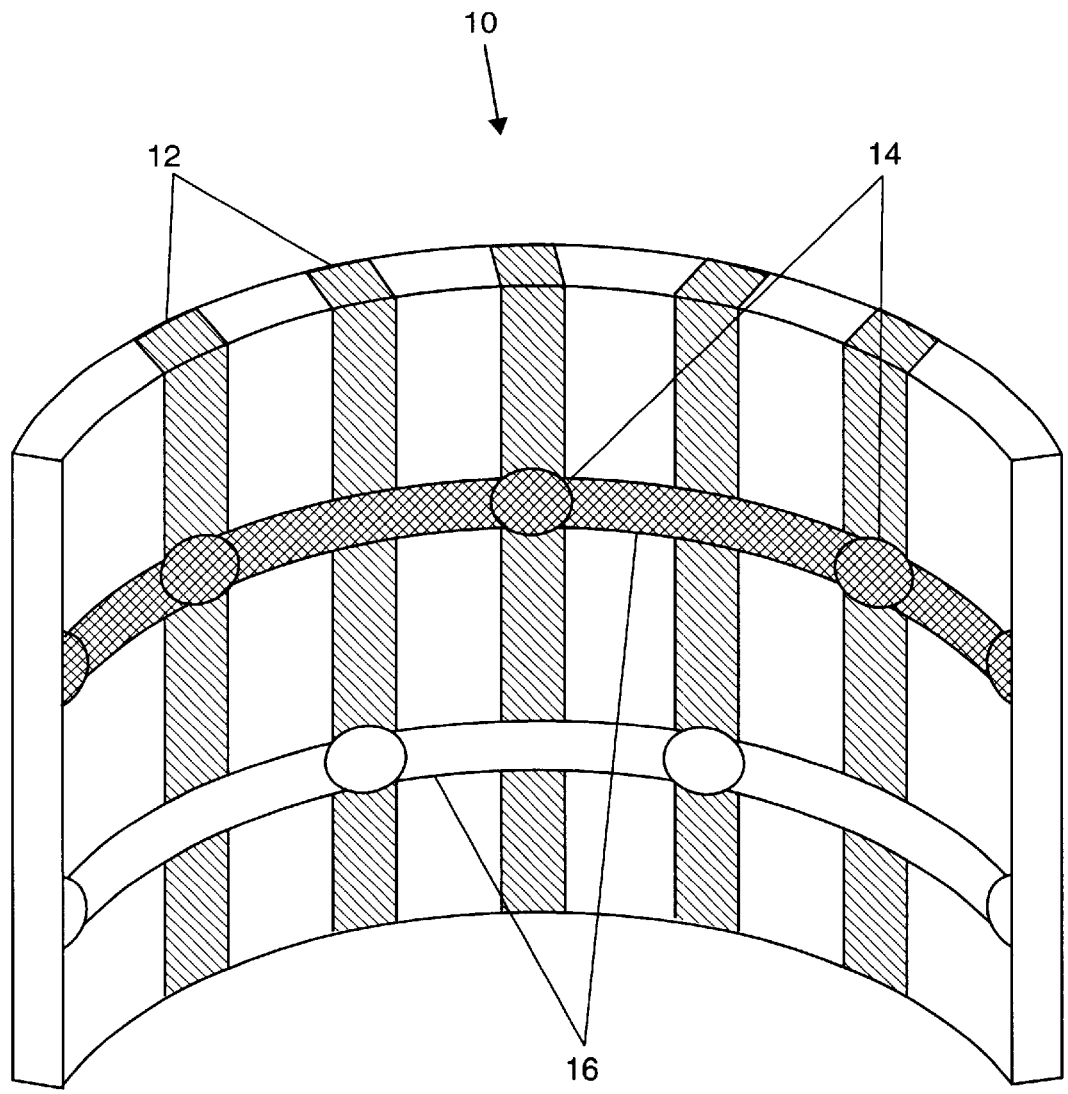
FIG. 1 is an isometric view of a section of a tangentially poled ceramic cylinder having a prior art daisy chain electrical wire configuration.

FIG. 1 is an isometric view of a section of a ceramic cylinder having a daisy chain configuration, which is used in current systems. The ceramic cylinder 10 includes stripe electrodes 12 to which electrical connections are made. In the daisy chain connection configuration, alternate electrodes are connected together through electrical wires 16 that are soldered at points 14 on stripe electrodes 12. The electrical wires 16 run along the inner circumference of the ceramic cylinder 10 and therefore are subject to both radial and tangential forces when the ceramic cylinder 10 vibrates in a hoop mode. During transducer operation, wire flexing occurs in more than one plane, thereby making this configuration prone to failure due to metal fatigue. The inventors conducted extensive tests on transducers using a daisy chain configuration to investigate the causes for failure. Based on the results of these investigative tests, the inventors designed several improved connection methods between electro-acoustic elements and electrical wires. In addition to transducers, these can be used in other electro-acoustic devices, such as loudspeakers.

Figure 2:
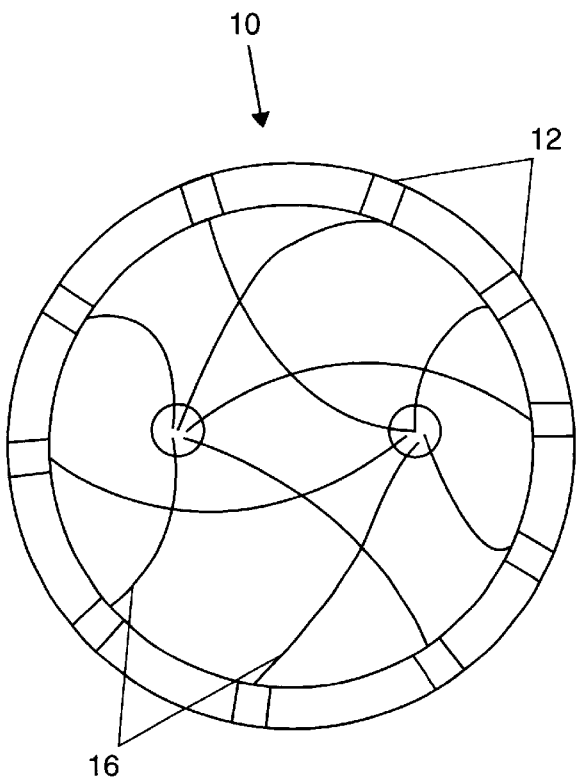
FIG. 2 is the top view of a star configuration of electrical connectors to the striped electrodes on a tangentially poled ceramic cylinder.

FIG. 2 is the top view of a ceramic cylinder 10 having a star electrical connector configuration. This configuration has been designed by the inventors and tested for failure due to metal fatigue. In this configuration, electrical wires 16 are connected to stripe electrodes 12 at one end, and the other ends of the electrical wires 16, originating from alternate stripe electrodes, are grouped together to form positive and negative electrical connections. When grouped together, the electrical wires 16 were arranged by the inventors to be substantially perpendicular to the inner circumference of the ceramic cylinder 10. This arrangement prevents tangential forces from acting on the solder joints and electrical wires 16 during transducer operation. Comparative metal fatigue tests conducted by the inventors on the daisy chain configuration of FIG. 1, and the star configuration of FIG. 2, demonstrated substantial reduction in failure due to metal fatigue in transducers with tangentially poled ceramic cylinders using the star configuration as opposed to the daisy chain configuration.

Figure 3:
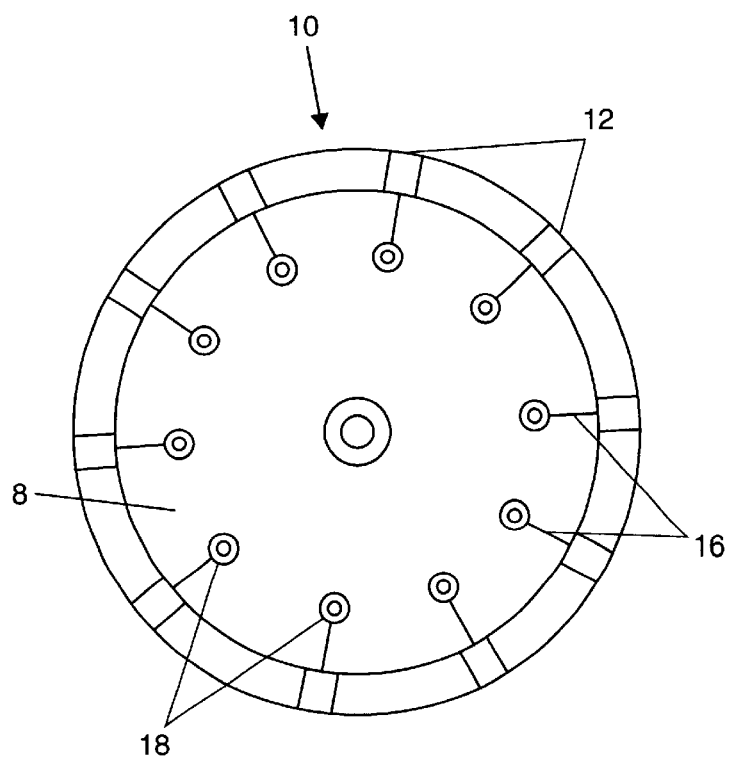
FIG. 3 is the top view of a pin configuration of electrical connectors to the striped electrodes on a tangentially poled ceramic cylinder.

FIG. 3 is an isometric view of a ceramic cylinder having pin electrical connector configuration. This method of connection was designed by the inventors to build upon the concept of controlling the geometry of electrical connectors to the cylinder surface used in the earlier invented star configuration of FIG. 2. The inventors connected electrical wires 16 to stripe electrodes 12 at one end and to pins 18 at the other end to maintain perpendicularity of the electrical wires 16 to the inner surface of the ceramic cylinder 10. Pins 18 were mounted on a core portion 8 and were arranged within ceramic cylinder 10 in a manner to correspond to stripe electrodes 12. As in the daisy chain and star configurations, alternate stripe electrodes were connected together to form positive and negative electrical connections. The inventors conducted metal fatigue tests on the pin connection configuration, and found that failure due to metal fatigue in this configuration was minimal.

Figure 4:
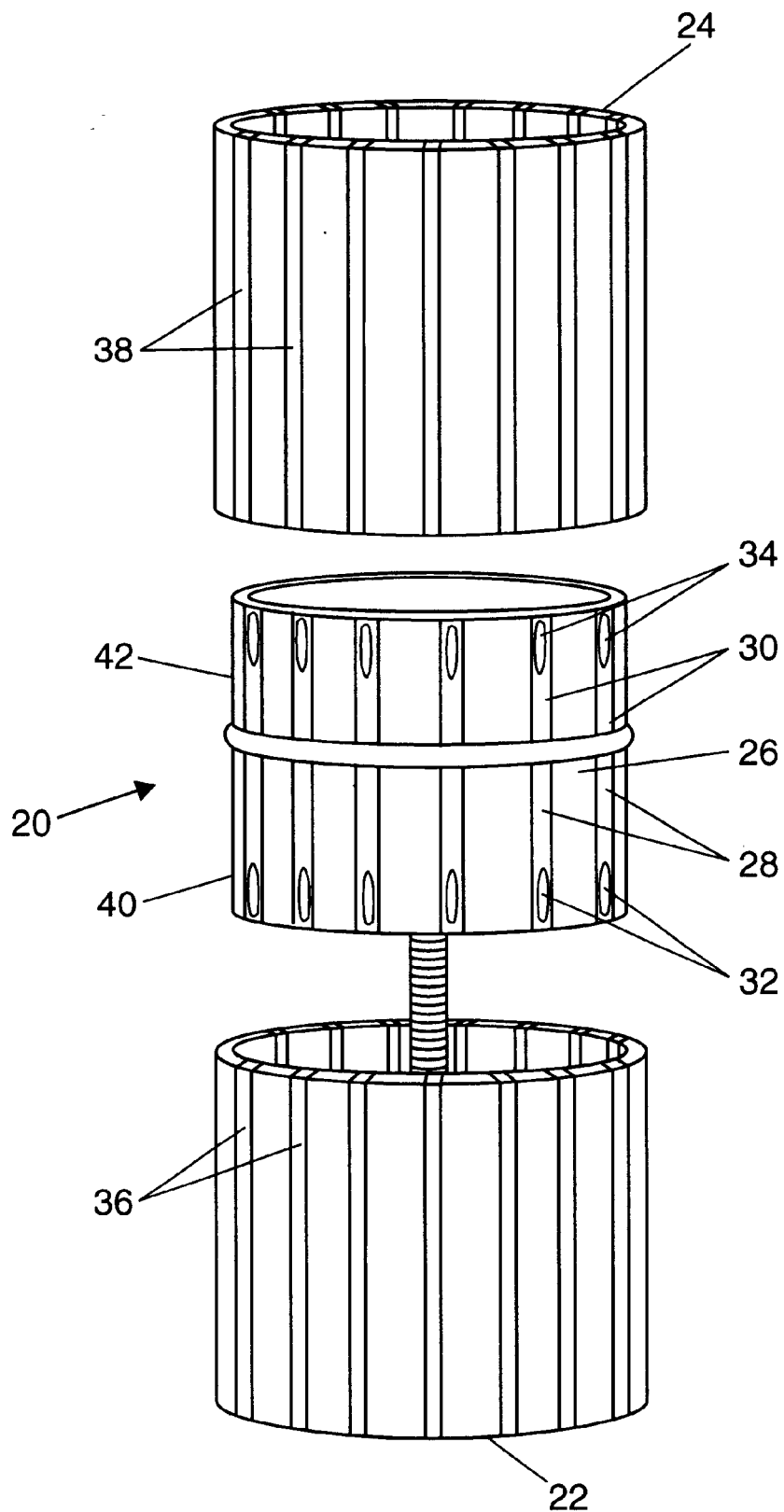
FIG. 4 is an isometric view of one embodiment of the plug connector of the present invention along with ceramic cylinders that fit onto either side of the plug connector.

After obtaining favorable results with the pin configuration, the inventors applied their efforts to methods for the entire elimination of solder joints between the electrical wires and the ceramic cylinder. The inventors' endeavor was successful, and solder joints were replaced by pressure contacts. These pressure contacts provided the required electrical conductance, and further provided the required control of the geometry between the surface of the ceramic cylinder and the contacts that the solder joint could not provide. FIG. 4 is an embodiment of a plug connector that the inventors designed to eliminate the use of solder joints. The plug connector 20 has a core portion 26, with two sides 40 and 42. Each side contains a plurality of slots 28 and 30 for a plurality of metal electrical contacts 32 and 34. These metal electrical contacts correspond with a plurality of stripe electrodes 36 and 38 on the ceramic cylinders 22 and 24. Alternate metal electrical contacts 32 and 34 are connected together (not shown) to form positive and negative electrical connections. Ceramic cylinders 22 and 24 are fitted into sides 40 and 42 respectively such that stripe electrodes 36 and 38 are in contact with metal electrical contacts 32 and 34 respectively.

Since the solder joint has been replaced by a pressure connection, there is an increased resistance between the edge connector and the electrode because of the absence of a continuous joint. The resistance between the metal electrical contacts 32 and 34 and the stripe electrodes 36 and 38, respectively, decreases as pressure increases. Increased pressure is therefore desirable in order to make the resistance between the edge contact and the electrode approach a value approximate to that of a solder joint. Increasing the pressure beyond a threshold level makes the contact rigid, resulting in an increase of wear and tear. A compromise has to be made regarding the amount of pressure applied so that the wear and tear is kept to an acceptable limit. Therefore, the electrical contacts 32 and 34 are positioned such that, upon fitting the ceramic cylinders 22 and 24, pressure between them and the electrical contacts 32 and 34 provides sufficient electrical conductance. This occurs while maintaining a degree of mechanical freedom between the surface of the cylinder or shell and the electrical contacts 32 and 34.

There are two general categories of plug connectors 20. One is a plug connector as shown in FIG. 4 which has a body made of an insulating material with slots on the periphery of the core portion of the plug connector. These slots house PC type edge connectors, which make electrical contact with the striped electrodes on the ceramic cylinders. In the insulator type plug connector, the insulating body itself does not serve to connect the positive and negative connections together. A separate method such as electrical wires connecting alternate PC type edge connectors has to be used. The other type of plug connector is one in which the body of the connector is made of a conducting material. Here the conducting body also serves to connect the positive and negative connectors together, thereby eliminating the need for additional connecting wires to group positive and negative electrical connectors together. The physical design of plug connector 20 can vary depending on the application and the objectives, but the concept remains the same.

Figure 5:
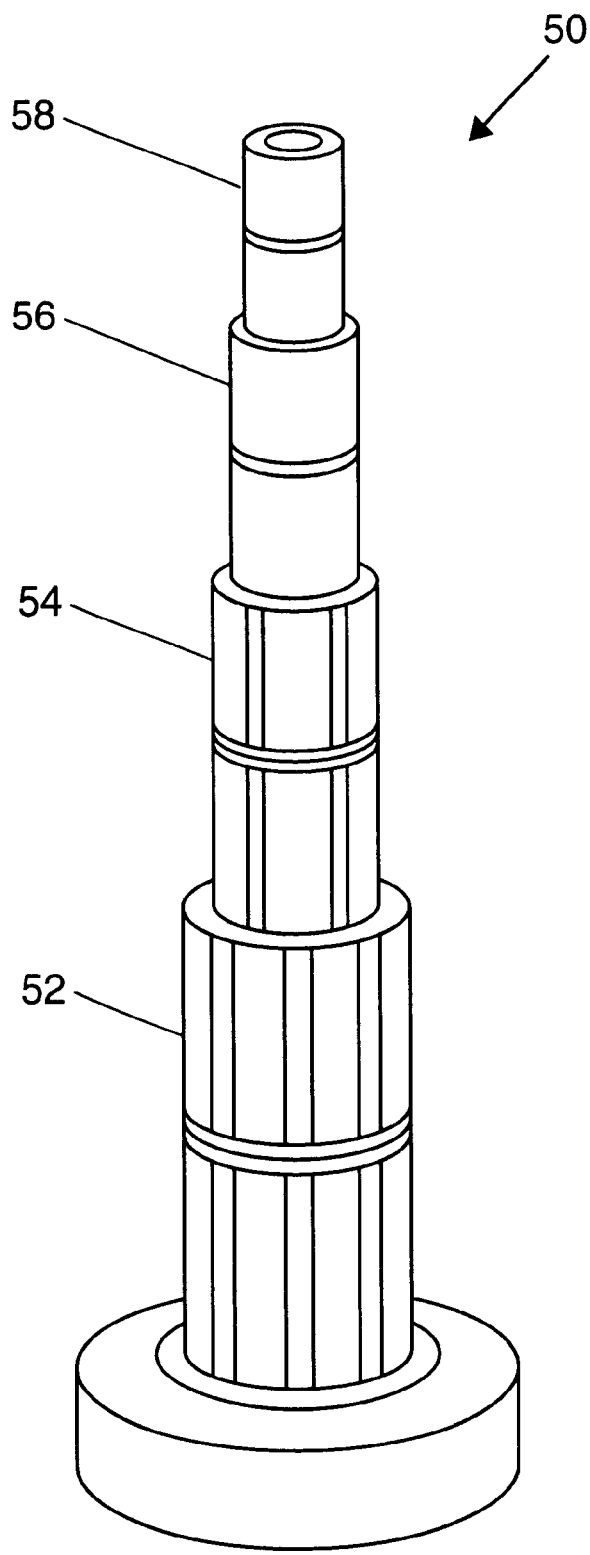
FIG. 5 is an isometric view of a 4-channel stacked cylinder transducer composed of 4 tangentially poled cylinders and 4 radially poled cylinders.
Figure 6:
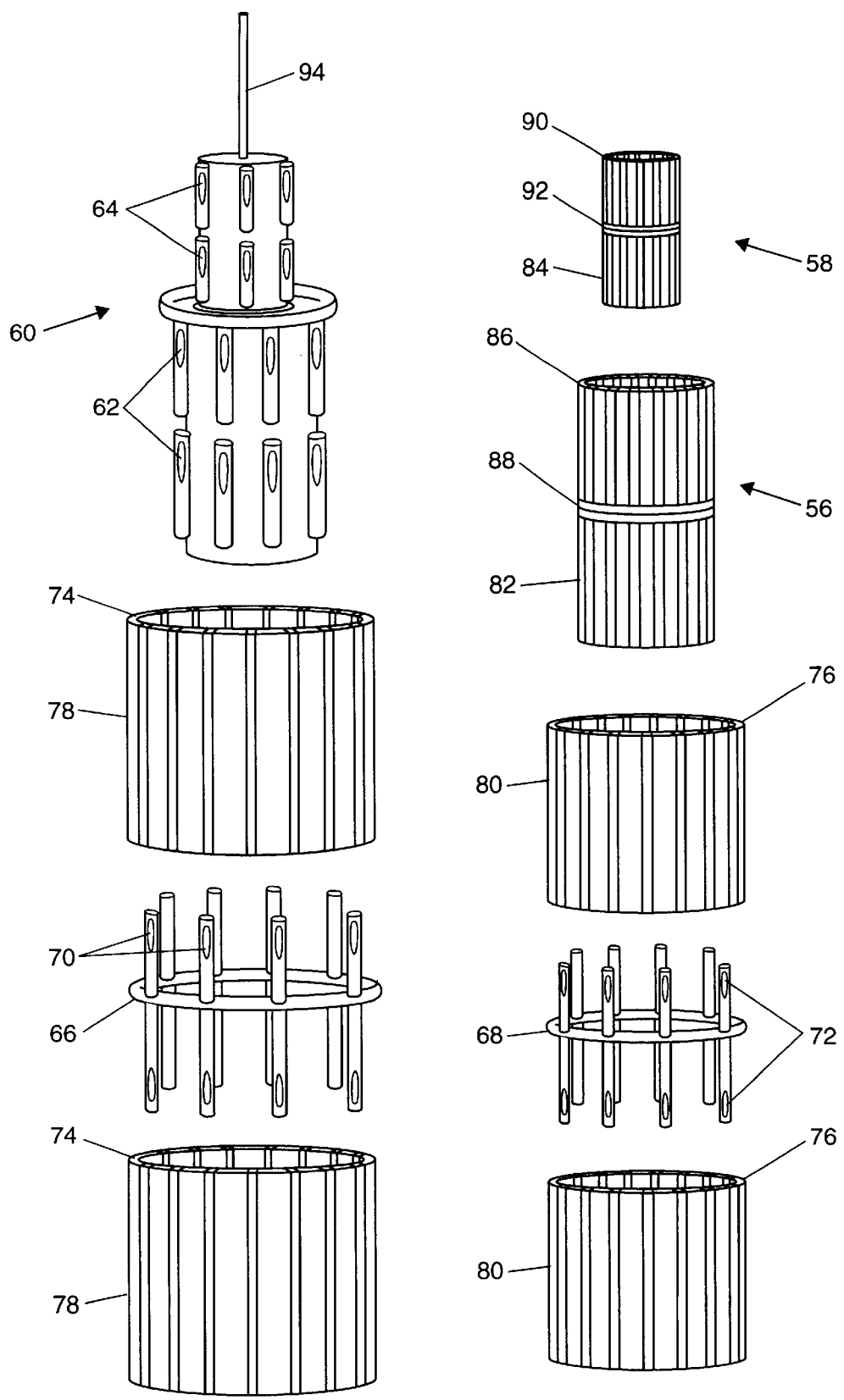
FIG. 6 is an exploded view of a 4-channel stacked cylinder using a modified plug connector of the present invention.

FIGS. 5 and 6 together show a 4-channel stacked cylinder transducer 50 using a preferred embodiment of a plug connector. This was designed and satisfactorily tested by the inventors. The system shown in FIGS. 5 and 6 can be modified for any number of channels and is not limited to a 4-channel stacked cylinder transducer. Channel-1 52 has the largest dimension and lowest frequency and channel-4 58, has the smallest dimension and highest frequency. Channel-2, 54, and 3, 56, are intermediate frequency channels. The transducer is composed of eight cylinders, two per channel. Two cylinders per channel, with a gap between them, are used instead of one cylinder per channel to prevent the length mode resonance to interfere with the desired hoop mode. Tangentially poled cylinders are used in channels 1 and 2 while radially poled cylinders are used in channels 3 and 4.

The plug connector design for the tangentially poled cylinders in channels 1 and 2 consists of: (1) foundation piece 60 that houses the edge contacts 62 and 64 that connect to the negative stripes in channels 1 and 2, and (2) spiders 66 and 68, one each for channels 1 and 2, contain the edge contacts 70 and 72 that connect to the positive stripes.

The negative foundation piece 60, and foundation pieces (not shown) that fit on opposite ends of channel 1 and channel 2, have raised projections with slots into which edge contacts 62 and 64 are placed. Similarly, the positive spiders 66 and 68 have legs with slots into which edge contacts 70 and 72 are placed. Rubber isolation rings 74 and 76 are fitted against the ends of tangentially poled cylinders 78 and 80 in channels 1 and 2.

Channel 1 is assembled by sliding isolation rings 74 and ceramic cylinders 78 onto foundation piece 60 and positive spider 66. Channel 2 is assembled by sliding isolation rings 76 and ceramic cylinders 80 onto foundation piece 60 and positive spider 68.

The plug connector pieces are made of an electrically and thermally conductive material so as to minimize the number of electrical connections and also to provide good heat transfer from the ceramic cylinders. Aluminum is a material that will serve the above mentioned preferences, though other well known conducting materials used in the art may be used for the plug connector. An acoustic isolator such as Corprene or silicone rubber can be used between the aluminum pieces and the ceramic to provide acoustic and electrical isolation.

Channel-3 56 and channel-4 58 of the preferred 4-channel stacked cylinder transducer, shown in FIG. 5 and 6, each use a pair of radially poled ceramic cylinders with an isolating junction between them. Ceramic cylinders 82 and 84 are plated with an electrically conducting material on their outer and inner surfaces. These ceramic shells are poled in 3/1 mode where the electric field is perpendicular to the direction of mechanical motion during transducer operation.

Channel 3 is assembled by sliding isolation rings 86 and ceramic cylinders 82 onto plastic contact carrier 88 that contains positive contacts. Channel 4 is assembled by sliding isolation rings 90 and ceramic cylinders 84 onto plastic contact carrier 92 that contains positive contacts. The negative connection is made to the outer surface of the ceramics in channels 3 and 4 using conductive tape (not shown). Threaded rod 94 is used to fix the channel 3 & 4 assembly to the channel 1 & 2 assembly.

Although the present invention has been described with reference to certain preferred embodiments thereof, other versions are readily apparent to those of ordinary skill in the art. Therefore, the spirit and scope of the appended claims should not be limited to the description of the preferred embodiments contained herein.

What is claimed is:

1. An electro-acoustic apparatus that vibrates during operation, said apparatus comprising:

an electrically conducting surface having a direction of vibration; and a moveable electrical connector in pressure contact with said surface;

wherein said connector is positioned to move in conjunction with said surface in said direction of vibration and maintain contact with said surface when said surface vibrates.

2. The apparatus as claimed in claim 1, wherein said electrically conducting surface is a plated surface of a ceramic shell.

3. The apparatus as claimed in claim 2, wherein said ceramic shell forms a portion of a channel of a transducer.

4. The apparatus as claimed in claim 2, wherein said ceramic shell is one of a pair of ceramic shells that form a portion of a transducer channel.

5. The apparatus as claimed in claim 4, wherein said pair of ceramic shells is separated by an isolator to provide acoustic isolation between said pair of ceramic shells.

6. The apparatus as claimed in claim 5, wherein said isolator further comprises a middle portion and a pair of side members dimensioned to fit inside said middle portion, wherein each of said pair of side members have an embedded air channel, such that said embedded air channel substantially increase acoustic isolation between said pair of ceramic cylinders.

7. The apparatus as claimed in claim 1, wherein said moveable electrical connector comprises a plug having a core with a plurality of slots and a plurality of edge type electrical contacts embedded in said slots.

8. The apparatus as claimed in claim 7, wherein said core of said plug is constructed of an electrically insulating material, and wherein said edge type contacts form a first group and a second group, and wherein said first group is attached together via electrical conductors to provide a positive group of contacts, and wherein said second group is attached together via electrical conductors to provide a negative group of contacts.

9. The apparatus as claimed in claim 7, wherein said core of said plug is constructed of an electrically conducting material such that said core portion forms an electrically conductive path for said edge type electrical contacts.

10. The apparatus as claimed in claim 9, wherein said edge type contacts comprise a positive group and a negative group.

11. The apparatus as claimed in claim 10, wherein said plug is constructed of a thermally conductive material.

12. A plug connector apparatus for a transducer, said apparatus comprising:
- a core having two sides, said first sides being dimensioned to receive cylinders having stripe electrodes;
- a plurality of slots in said sides to correspond to said stripe electrodes in said cylinders; and
- a plurality of metal electrical contacts, said contacts being inserted into said slots;
- wherein said metal electrical contacts are alternatively linked to form positive and negative connections, and wherein said cylinders slide into said sides such that said cylinders make electrical connections to said contacts through pressure contact.

13. The apparatus as claimed in claim 12, wherein said core is constructed of a thermally conductive material to pull heat away from said cylinders.

14. The apparatus as claimed in claim 12, wherein said core is constructed is constructed of an electrically insulating material, and wherein said edge type contacts form a first group and a second group, and wherein said first group is attached together via electrical conductors to provide said positive connection, and wherein said second group is attached together via electrical conductors to provide said negative connection.

15. The apparatus as claimed in claim 12, wherein said core is constructed of an electrically conducting material such that said core portion forms an electrically conductive path for said edge type electrical contacts.

16. A transducer with a plug connector apparatus, comprising:
- a pair of ceramic cylinders;
- a plurality of stripe electrodes on said pair of ceramic rings; and
- a plug connector first and second sides and having edge contacts in pressure contact with said stripe electrodes;
- wherein said pair of ceramic rings fit onto said first and second sides of said plug connector, and said edge contacts in pressure contact with said stripe electrodes form an electrical connection.

* * * * *